United States Patent
Ibrahim et al.

(10) Patent No.: US 8,012,799 B1
(45) Date of Patent: Sep. 6, 2011

(54) METHOD OF ASSEMBLING SEMICONDUCTOR DEVICE WITH HEAT SPREADER

(75) Inventors: Ruzaini Ibrahim, Bandar Puncak Alam (MY); Seng Kiong Teng, Segamat (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/795,664

(22) Filed: Jun. 8, 2010

(51) Int. Cl.
*H01L 21/00* (2006.01)

(52) U.S. Cl. ........ 438/107; 438/110; 438/113; 438/122; 438/127

(58) Field of Classification Search .................. None
See application file for complete search history.

(56) References Cited

U.S. PATENT DOCUMENTS

| | | | |
|---|---|---|---|
| 6,246,115 B1 * | 6/2001 | Tang et al. | 257/706 |
| 6,432,742 B1 * | 8/2002 | Guan et al. | 438/106 |
| 6,432,749 B1 * | 8/2002 | Libres | 438/122 |
| 6,603,154 B2 * | 8/2003 | Sakai et al. | 257/166 |
| 6,614,123 B2 * | 9/2003 | Lee et al. | 257/796 |
| 6,921,683 B2 * | 7/2005 | Nakayama | 438/122 |
| 6,951,776 B2 * | 10/2005 | Lo et al. | 438/122 |
| 7,064,429 B2 * | 6/2006 | Bemmerl et al. | 257/713 |
| 7,638,367 B2 * | 12/2009 | Akutagawa et al. | 438/126 |
| 7,820,486 B2 * | 10/2010 | Ohtani | 438/113 |
| 2007/0235859 A1 | 10/2007 | Espiritu | |
| 2009/0221114 A1 | 9/2009 | Xu | |
| 2009/0236713 A1 | 9/2009 | Xu et al. | |

OTHER PUBLICATIONS

R. Ibrahim, L.C. Tan, K.H. Tan, and Calvin Lo, Heat Spreader in Array Design to Minimize Processing Time, IP.COM IPCOM000007584D, Apr. 8, 2002.

* cited by examiner

*Primary Examiner* — Scott B Geyer
(74) *Attorney, Agent, or Firm* — Charles Bergere

(57) ABSTRACT

A method for packaging a semiconductor die or assembling a semiconductor device that includes a heat spreader begins with attaching the heat spreader to a film and dispensing a mold compound in granular form onto the film such that the mold compound at least partially covers the film and the heat spreader. The film with the attached heat spreader is placed in a first mold section. A substrate having a semiconductor die attached and electrically coupled to it are placed in a second mold section and then the first and second mold sections are mated such that the die is covered by the heat spreader. The granular mold compound is then melted so that the mold compound covers the die and sides of the heat spreader. The first and second mold sections then are separated. The film, which adheres to the substrate, is removed to expose a top surface of the heat spreader, and thus a semiconductor device is formed.

17 Claims, 4 Drawing Sheets

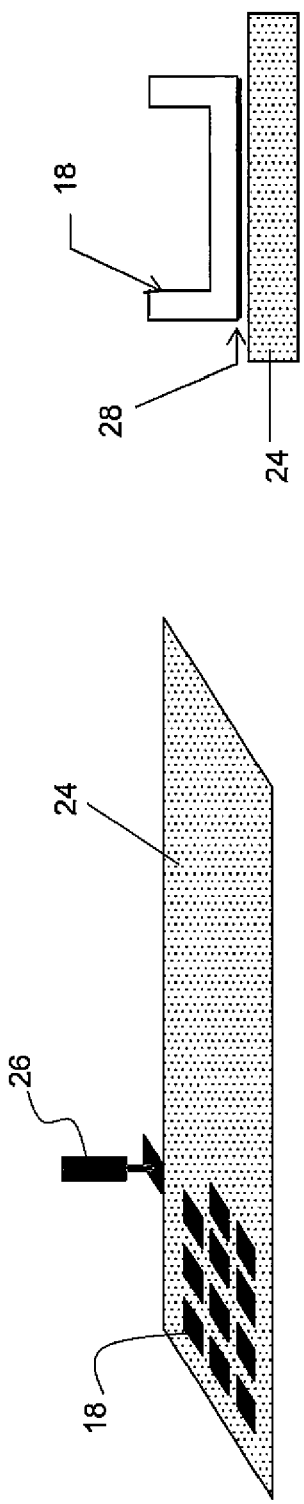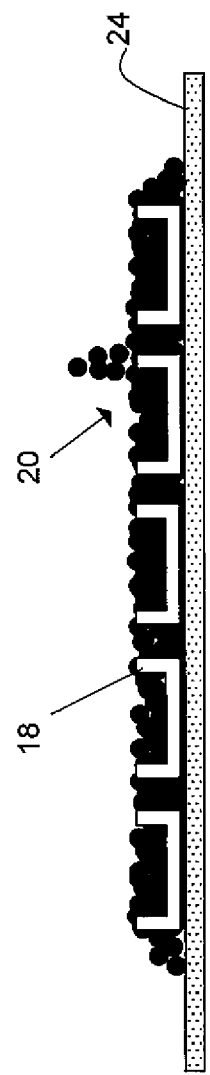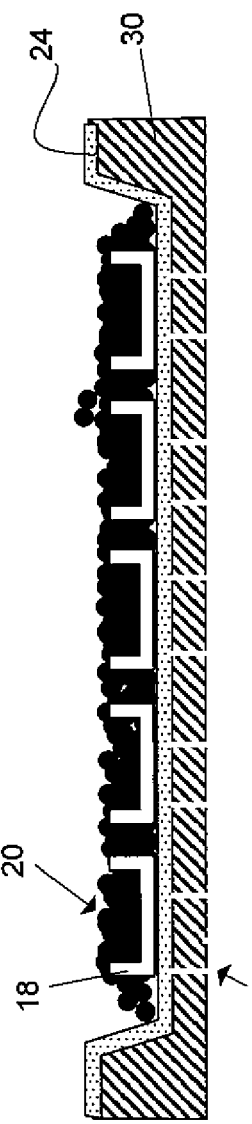
FIG. 2A
FIG. 2B
FIG. 3
FIG. 4

METHOD OF ASSEMBLING SEMICONDUCTOR DEVICE WITH HEAT SPREADER

BACKGROUND OF THE INVENTION

The present invention relates generally to semiconductor packaging, and more particularly to a method of assembling a semiconductor device that includes a heat spreader.

As is well known, integrated circuits are formed on semiconductor dies. Such circuits are formed with multiple layers of materials, e.g., conductors and insulators that interconnect tiny transistors. The dies can include hundreds of thousands and even millions of transistors. Thus, in operation, a substantial amount of heat can be generated by the circuit, especially if the circuit operates at a high voltage. One way of dissipating this heat is to use a heat spreader. A heat spreader, which in its simplest form is a metal plate, conducts heat away from the die so that the circuit does not over heat.

In order to protect the semiconductor dies, the dies are attached and electrically connected to a substrate and then the substrate and die are encapsulated with a plastic material. Interconnections to the die are provided by way of the substrate. One popular external connection is a ball grid array (BGA), which is an array of conductive balls attached to the bottom of the substrate. Wires or metal lines (provided in multiple layers) in the substrate allow for electrical connection between the conductive balls and the pads on the die. One way of assembling a BGA type device is to assemble an array of devices at the same time, which is known as MAP (Molded Array Package) BGA.

However, various process limitations have made it difficult to assemble a MAP BGA package that includes a heat spreader. For example, height variations of the individual heat spreaders will result in uneven mold clamping and mold compound bleeding on top of the heat spreader, and difficulties in mold flow control caused by the use of side gate molding where mold compound must flow across tight spacing, which can cause voids and wire sweep issues (movement or bond wires caused by flow of mold compound during molding). Thus, packages with heat spreaders have been limited to over molded plastic array carrier (OMPAC) type packages in which individual heat spreaders are directly attached to die after the die has been attached and electrically connected to the substrate. However, a problem faced by OMPAC packaging is that when the heat spreader is directly attached to the die before molding, when the mold chase is closed, a clamping force can be exerted on the die, causing the die to crack. Accordingly, it would be advantageous to be able to efficiently assemble MAP devices that include heat spreaders in which the risk of the die cracking was substantially reduced or eliminated.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 2A is a perspective view illustrating a step of attaching a heat spreader to a film and FIG. 2B is an enlarged view of the heat spreader attached to the film of FIG. 2A;

FIG. 3 illustrates a step of disposing a mold compound over the heat spreaders attached to the film of FIG. 2A;

FIG. 4 illustrates a step of disposing the film, heat spreaders and mold compound of FIG. 3 in a first mold chase section;

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method for packaging a semiconductor die or assembling a semiconductor device that includes a heat spreader. The method includes attaching the heat spreader to a film and dispensing a mold compound in granular form onto the film such that the mold compound at least partially covers the film and the heat spreader. The film with the attached heat spreader is placed in a first mold section. A substrate having a semiconductor die attached and electrically coupled to it are placed in a second mold section and then the first and second mold sections are mated such that the die is covered by the heat spreader. The granular mold compound is then melted so that the mold compound covers the die and sides of the heat spreader. The first and second mold sections then are separated. The film, which adheres to the substrate, is removed to expose a top surface of the heat spreader, and thus a semiconductor device is formed.

In another embodiment, the present invention is a packaged semiconductor device formed in accordance with the above-described method.

Figure 1:
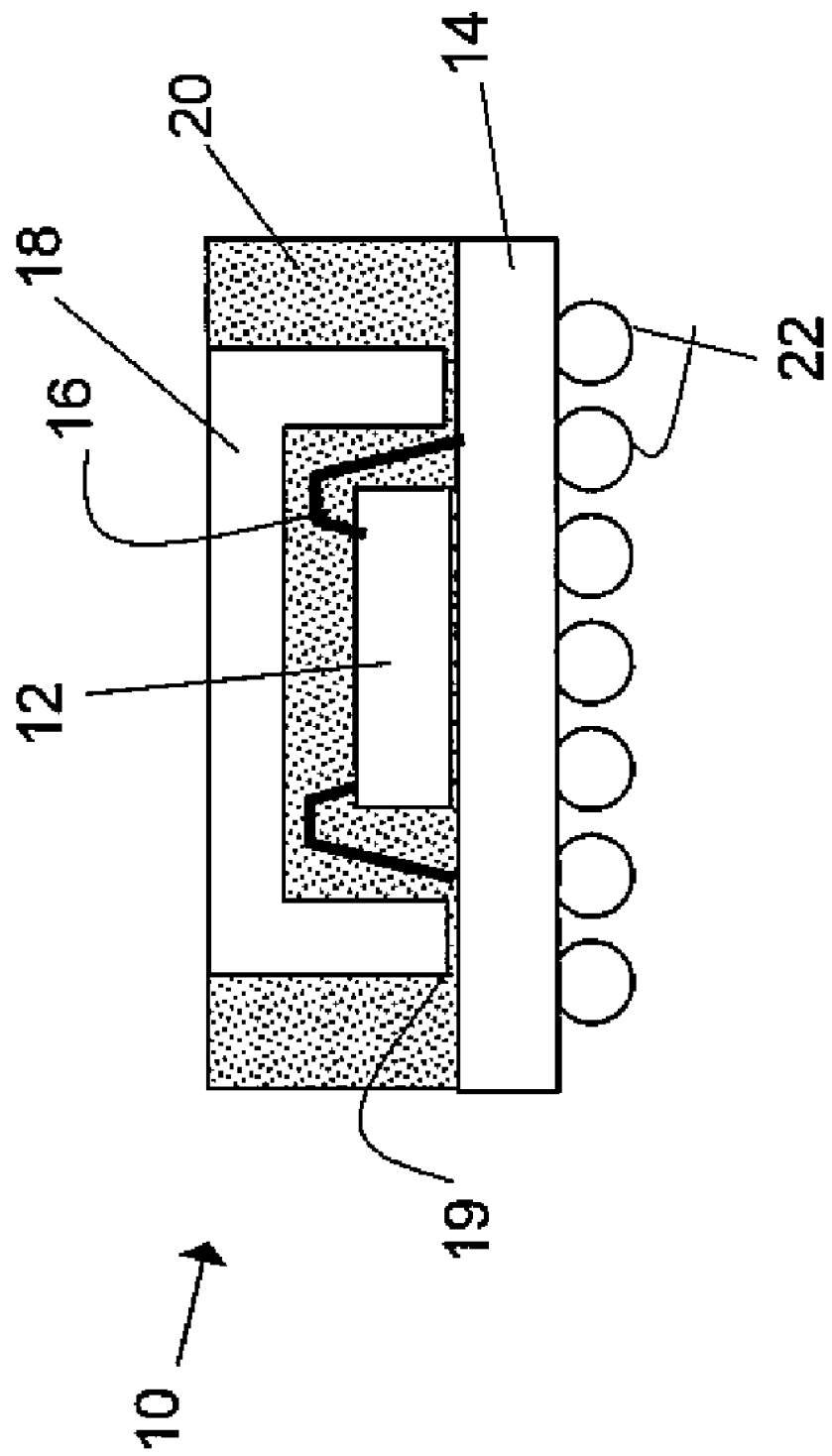
FIG. 1 is cross-sectional view of a packaged semiconductor device in accordance with one embodiment of the present invention.

Referring now to FIG. 1, an enlarged cross-sectional view of a packaged semiconductor device 10 is shown. The device 10 includes a semiconductor die 12 attached and electrically connected to a multi-layer wiring substrate 14. The die 12 and substrate 14 are well known components of semiconductor devices and thus detailed descriptions thereof are not necessary for a complete understanding of the present invention. One way of attaching and electrically connecting the die 12 to the substrate 14 is with solder balls (not shown) attached to an underside of the die 12. The solder balls interconnect conductive terminals of the die 12 with the wiring pattern formed in the substrate 14. An underfill material 16 like epoxy is disposed in a gap between the die 12 and the substrate 14. Another way of electrically connecting the die 12 to the substrate 14 is with wires 16. The wires 16 are bonded to pads on an active surface of the die 12 and to corresponding contact pads on the substrate, as shown in FIG. 1, using a well known wire bonding process and known wire bonding equipment.

The device 10 includes a heat spreader 18, which in the embodiment shown, has a generally U-shaped cross-section. The heat spreader 18 may be formed of any material that has good heat conduction properties. One such material that is known and used in the art is copper. Heat spreaders are well known in the art. The heat spreader 18 overlies the die 12 such that the die 12 is inside the heat spreader 18. The heat spreader 18 is sized and shaped to cover the die 12 and the wires 16, but not to contact the die 12 or wires 16. Further, in one embodiment of the invention, the heat spreader 18 does not contact the substrate 14 either. Instead, there is a gap 19 between the heat spreader 18 and the substrate 14. A mold compound 20 covers the top and side surfaces of the die 12, a top surface of the substrate 14, and the wires 16, and is within the gap 19 between the heat spreader 18 and the substrate 14. The mold compound 20 may be formed of a plastic material, as is known in the art.

Connection balls 22 are attached to an underside of the substrate 14 and provide for external electrical connection to the die 12 by way of the substrate 14 and wires 16. For example, the connection balls 22 may be C4 (controlled collapse chip connector) solder balls.

Although the individual elements of the semiconductor device 10 comprise well known elements, these elements have not been easy to assemble especially for a MAP process. However, the inventors have discovered a novel method of forming the semiconductor device 10 using a MAP process, which will be described with reference to FIGS. 2-9. A molding operation with a cavity-down concept is performed, which enables embedding individual heat spreaders in the devices 10, and thus avoids the requirement for a pre-mold heat spreader to die attachment process. A free flow molding process accommodates tight spacing and allows for the use of a high thermal mold compound without significant risk of wire sweep or other mold compound flow related issues.

Referring now to FIG. 2A, an illustration of a step of placing heat spreaders 18 onto a mold release film 24 is shown. A pick and place machine 26 may be used to place the heat spreaders 18 on the film 24. The film 24 preferably is heat resistant. In one embodiment, the film 24 has an adhesive on at least one of its opposing major surfaces that allows the heat spreader 18 to be attached to one of the major surfaces. The opposing surface may or may not include an adhesive that allows the film 24 to adhere to a mold cavity, as discussed in more detail below. Another way of attaching the heat spreader 18 to the film 24 is with a double-sided adhesive tape 28, as shown in FIG. 2B. Other methods may be used to attach the heat spreader 18 to the film 24, however, it is important that the means by which the heat spreader 18 is attached to the film 24 may be disabled, i.e., that the heat spreader 18 may be disengaged from the film 24, as discussed in more detail with reference to FIG. 8.

The heat spreader 18 comprises a material that has good heat conduction properties, such as copper. In the embodiment shown, the heat spreader 18 has a generally U-shaped cross-section. However, the invention can accommodate other shapes of heat spreaders, such a T-shaped heat spreader. If a T-shaped heat spreader, for example, is used, then the base of the "T" would be attached to the surface of the die and the top of the "T" would be exposed.

FIG. 3 is a side cross-sectional view showing a mold compound 20 in granular form disposed over and between the heat spreaders 18, and on the release film 24. The mold compound 20 should at least partially cover the heat spreaders 18 and the film 24. The mold compound 20 may be distributed over and between the heat spreaders 18 with a nozzle of a conventional dispensing machine, as is known in the art. The mold compound 20 may be an epoxy resin compound in granular form conventionally used for compression molding. The granular molding compound 20, such as granular epoxy resin, used in compression molding is less expensive and easier to store then the liquid compounds also used in conventional IC die packaging processes. Although a granular molding compound is preferred in one embodiment of the present invention, in alternative embodiments, the molding compound 20 may be in other forms suitable for compression molding, such as pellets, powder, gels, liquids, and so forth. Further, other molding methods may be employed, such as injection molding. If injection molding is used, the mold chase may be either a center-gate or side-gate type.

FIG. 4 shows the film 24 with the attached heat spreaders 18 and the granular mold compound 20 after being placed into a first section 30 of a mold chase. Note that the granular mold compound may be disposed over the heat spreaders 18 and film 24 after the film 24 with attached heat spreaders 18 has been placed in the first section 30 of the mold chase. In one embodiment of the invention, the first mold section 30 includes holes or passages 32 for allowing creation of vacuum pressure to hold the film 24 against the first section 30 of the mold chase. In other embodiments, the film 24 may include an adhesive so that the film 24 may be adhered to the first mold chase section 30. In an alternative embodiment of the present invention, the mold chase is a center gate molding type, which allows mold compound to be injected from a top of the mold chase into the mold cavity. In yet another alternative, the mold chase allows for injection of the mold compound from a side entry or passage way. For the center and side gate mold chases, injection molding is performed as opposed to using the granular mold compound 20.

Figure 5:
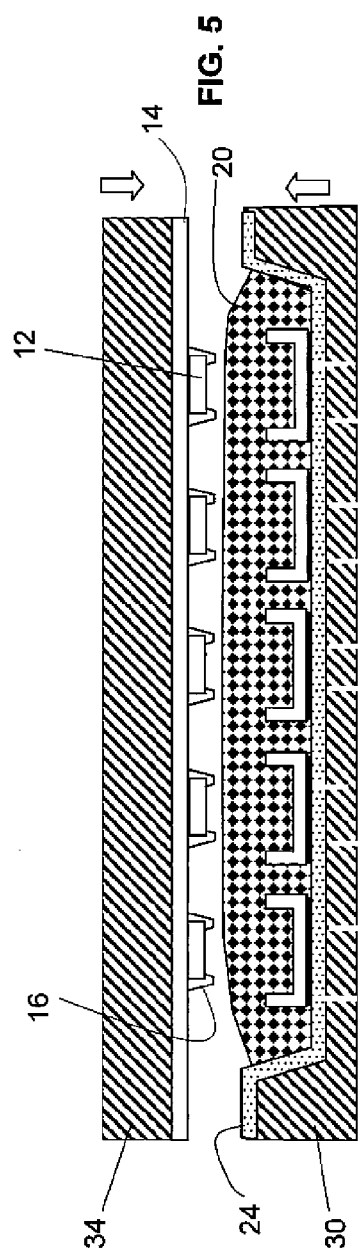
FIGS. 5, 6 and 7 illustrate steps of molding an array of semiconductor dies and corresponding heat spreaders.

FIG. 5 shows a second mold chase section 34 to which a bottom surface of a multi-layer wiring substrate 14 is attached. A plurality of semiconductor dies 12 are attached and electrically connected to a top surface of the substrate 14. In the example shown, the dies 12 are electrically connected to the substrate 14 with wires 16 by a known wire bonding process. In an alternative embodiment of the present invention, the dies 14 may be electrically connected to the substrate 14 with electrically conductive bumps, which also are known in the art. The substrate 14 may be attached to the second mold chase section 34 with an adhesive, a double-sided tape, vacuum pressure, or combinations of these methods. In the embodiment shown, the second mold chase section 34 is a top section of the mold chase that is lowered into the first or bottom mold chase section 30. The first mold chase section 30 and the heat spreaders 18 are sized and positioned so that when the mold chase is closed, i.e., when the second mold chase section 34 is lowered onto the first mold chase section 30, the dies 12 are received within the heat spreaders 18 such that the substrate 14 either contacts or comes near to contacting the bottom of the heat spreaders 18, but not so far that the wires 16 contact the heat spreaders 18. In one embodiment of the invention, prior to closing the mold chase or prior to the dies 12 being received within the heat spreaders 18, the mold compound 20 is at least partially melted.

Figure 6:
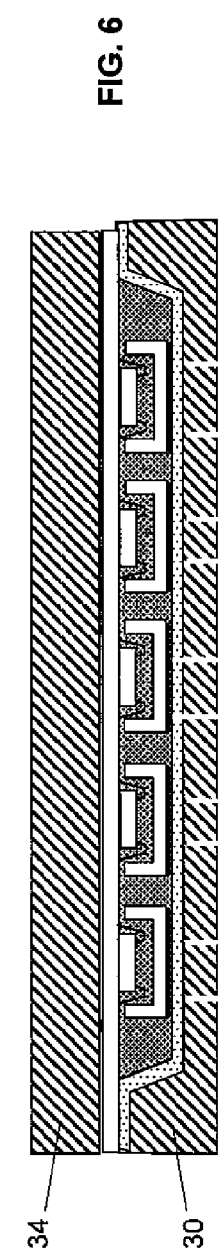
Figure 7:
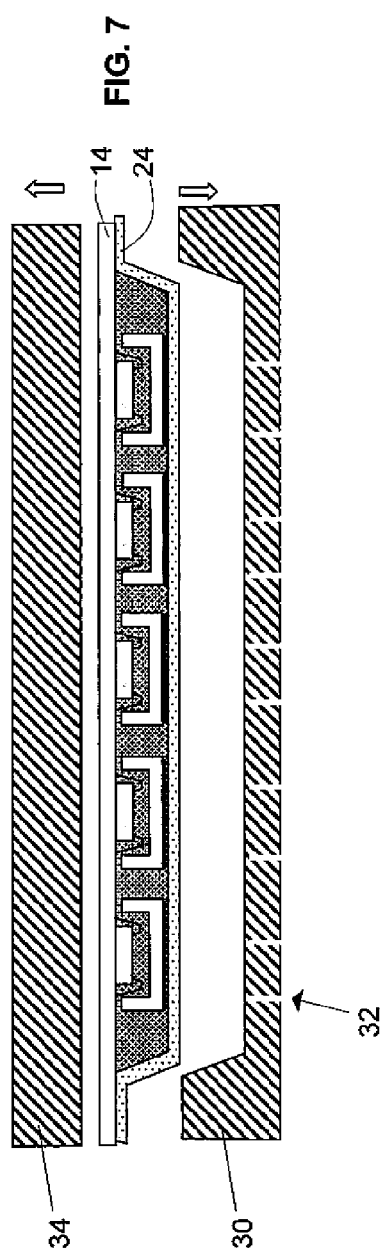

FIG. 6 is a cross-sectional side view of the mold chase in a closed position and a molding process being performed whereby the mold compound 20 is melted or liquefied via heating so that it covers the dies 12 and sides of the heat spreaders 18. The molding process may also include curing the mold compound while the film 24 and the substrate 14 are still within the first and second mold sections 30 and 34. After the molding process is completed, e.g., after post-mold cure, the first and second mold sections 30 and 34 are separated, and the devices, now in a molded array form, are removed as one from the mold chase, as shown in FIG. 7.

Figure 8:
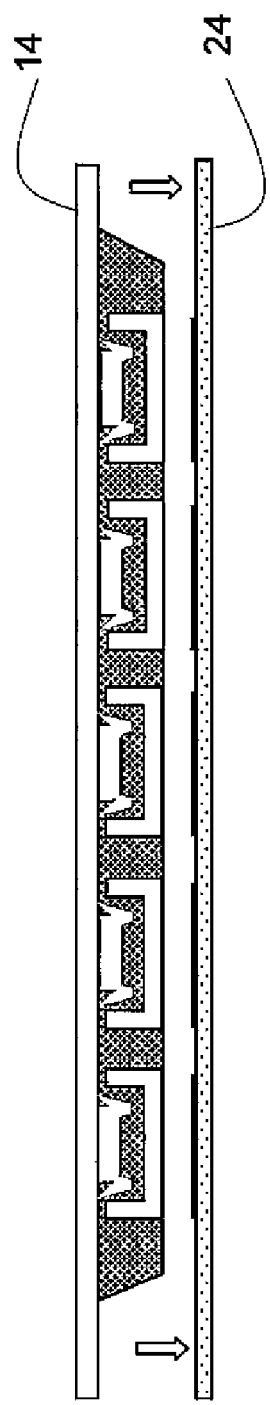
FIG. 8 illustrates a step of removing the film of FIG. 2A from the array of molded devices of FIG. 7.
Figure 9:
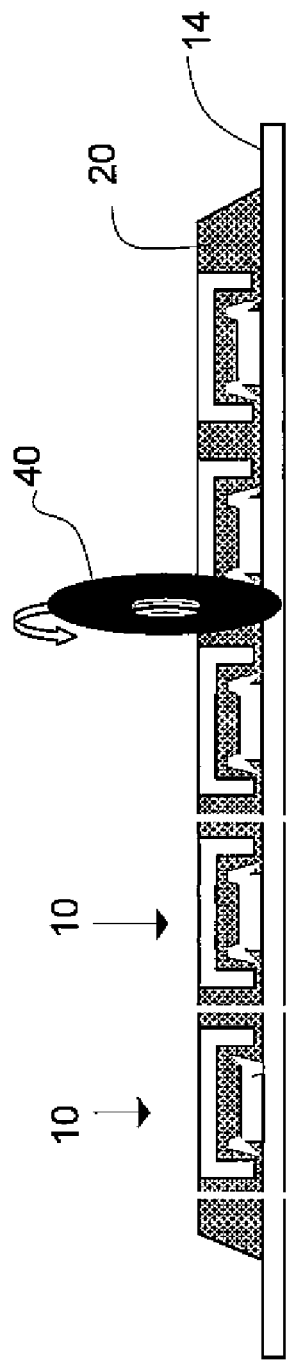
FIG. 9 illustrates a step of separating the array of molded devices into individual packaged devices.

At this point in the process, the film 24 is still attached to the heat spreaders 18 and thus in a next step, the film 24 is removed to expose a top surface of the heat spreaders 18, as shown in FIG. 8. FIG. 9 shows the devices 10 being separated from each other by a singulation process. Singulation processes are well known and may include cutting with a saw such as the saw 40 shown in FIG. 9, or a laser. Excess mold compound may be removed via grinding or other methods. The conductive balls 22 (FIG. 1) are attached, preferably after singulation, as is known in the art.

The present invention, as described above, allows for assembly of a semiconductor device with a heat spreader that does not require direct attachment of the heat spreaders onto wire bonded substrates prior to molding. The heat spreaders may be attached to the release film with a double-sided adhesive tape, which holds the heat spreader in place while a mold compound is dispensed over the heat spreaders and during molding. Easy de-taping after removing the array of devices from the mold chase is performed. Flow-free molding techniques may be used that accommodate tight spacing for mold compound filling without concern of wire sweep issues. Thus, the present invention provides a method of assembling a thermally enhanced MAPBGA package with floating heat spreader. The mold compound 18 that fills the gap 19 between the substrate 14 and the heat spreader 18 inhibits substrate delamination. A high thermal mold compound may be used with flow-free molding techniques.

By now it should be appreciated that there has been provided an improved semiconductor package and a method of making the improved semiconductor package. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method of assembling a semiconductor device including a heat spreader, the method comprising:
attaching the heat spreader to a film;
dispensing a mold compound onto the film such that the mold compound at least partially covers the film and the heat spreader;
placing the film with the attached heat spreader into a first mold section;
providing a substrate having a semiconductor die attached and electrically coupled thereto;
attaching the substrate with the attached die to a second mold section;
mating the first and second mold sections such that the die is covered by the heat spreader;
melting the mold compound at least until the mold compound covers the die and sides of the heat spreader;
separating the first and second mold sections, wherein the film adheres to the substrate; and
removing the film to expose a top surface of the heat spreader, whereby the semiconductor device is formed.

2. The method of assembling a semiconductor device of claim 1, wherein the film is heat resistant and has an adhesive on its opposing major surfaces.

3. The method of assembling a semiconductor device of claim 1, wherein the heat spreader has a generally U-shaped cross-section.

4. The method of assembling a semiconductor device of claim 3, wherein the heat spreader is spaced from the substrate.

5. The method of assembling a semiconductor device of claim 1, wherein the mold compound initially is in granular form.

6. The method of assembling a semiconductor device of claim 1, wherein the heat spreader is attached to the film with a double-sided tape.

7. The method of assembling a semiconductor device of claim 1, wherein the first mold section includes a mold cavity.

8. The method of assembling a semiconductor device of claim 7, wherein the film is adhered within the mold cavity of the first mold section with vacuum pressure.

9. The method of assembling a semiconductor device of claim 1, wherein the granular mold compound is melted by applying heat to the first and second mold sections.

10. The method of assembling a semiconductor device of claim 9, wherein the mold compound is cured, after melting, while the film and substrate are still within the first and second mold sections.

11. The method of assembling a semiconductor device of claim 1, further comprising the step of singulating the film to separate adjacent devices from each other.

12. A method of assembling a semiconductor device including a heat spreader, the method comprising:
attaching the heat spreader to a heat resistant film;
placing the film with the attached heat spreader into a first mold section;
dispensing a mold compound onto the film such that the mold compound at least partially covers the film and the heat spreader;
providing a substrate having a semiconductor die attached and electrically coupled thereto;

attaching the substrate with the attached die to a second mold section;

mating the first and second mold sections such that the die is covered by the heat spreader;

heating the mold compound, wherein after melting, at least the die and sides of the heat spreader are covered by the mold compound;

separating the first and second mold sections, wherein the film adheres to the substrate; and removing the film to expose a top surface of the heat spreader, whereby the semiconductor device is formed.

13. The method of assembling a semiconductor device of claim 12, wherein the heat spreader is spaced from the substrate.

14. The method of assembling a semiconductor device of claim 12, wherein the dispensing step occurs after the mating step.

15. A method of assembling a semiconductor device including a heat spreader having a generally U-shaped cross-section, the method comprising:

attaching the heat spreader to a heat resistant film with a double-sided tape;

dispensing a mold compound onto the film such that the mold compound at least partially covers the film and the heat spreader;

placing the film with the attached heat spreader into a first mold section;

providing a substrate having a semiconductor die attached and electrically coupled thereto;

attaching the substrate with the attached die to a second mold section;

mating the first and second mold sections such that the die is covered by the heat spreader;

melting the mold compound at least until the mold compound covers the die and sides of the heat spreader;

curing the mold compound;

separating the first and second mold sections, wherein the film adheres to the substrate; and removing the film to expose a top surface of the heat spreader, whereby the semiconductor device is formed.

16. The method of assembling a semiconductor device of claim 14, wherein the mold compound is initially in a granular form.

17. The method of assembling a semiconductor device of claim 14, wherein the heat spreader is spaced from the substrate.

\* \* \* \* \*